(12) United States Patent
Pang et al.

(10) Patent No.: US 7,517,788 B2
(45) Date of Patent: Apr. 14, 2009

(54) SYSTEM, APPARATUS, AND METHOD FOR ADVANCED SOLDER BUMPING

(75) Inventors: Mengzhi Pang, Phoenix, AZ (US); Christopher J. Bahr, Maricopa, AZ (US); Ravindra Tanikella, Phoenix, AZ (US); Charan Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 264 days.

(21) Appl. No.: 11/321,103

(22) Filed: Dec. 29, 2005

(65) Prior Publication Data

US 2007/0152024 A1    Jul. 5, 2007

(51) Int. Cl.
*H01L 21/44* (2006.01)
*H01L 23/48* (2006.01)
(52) U.S. Cl. ............. 438/613; 438/612; 438/615; 257/E21.508
(58) Field of Classification Search ............ 438/612, 438/613, 615, E21.508; 257/737
See application file for complete search history.

(56) References Cited

U.S. PATENT DOCUMENTS

| 5,672,542 | A | * | 9/1997 | Schwiebert et al. ......... 438/4 |
| 6,165,885 | A | | 12/2000 | Gaynes et al. |
| 6,271,107 | B1 | | 8/2001 | Massingill et al. |
| 6,420,255 | B1 | * | 7/2002 | Takahashi ............... 438/613 |
| 6,461,953 | B1 | | 10/2002 | Sakuyama et al. |
| 6,897,142 | B2 | * | 5/2005 | Fujimori et al. ........... 438/615 |
| 2004/0046252 | A1 | | 3/2004 | Fujimori et al. |
| 2006/0110907 | A1 | * | 5/2006 | Sakurai et al. ............. 438/612 |

FOREIGN PATENT DOCUMENTS

EP    0 675 532 A2    10/1995

OTHER PUBLICATIONS

"PCT International Search Report of the International Searching Authority", mailed Apr. 27, 2007, for PCT/US2006/047333, 4pgs.

* cited by examiner

*Primary Examiner*—Nitin Parekh
(74) *Attorney, Agent, or Firm*—Buckley, Maschoff & Talwalker LLC

(57) ABSTRACT

According to some embodiments, a method, apparatus, and system are provided. In some embodiments, the method includes providing solder resist material on a surface of a substrate, applying mask material on top of the solder resist material, reflowing solder located in an opening formed through both the solder resist material and the mask material, and removing the mask material after the reflowing of the solder.

10 Claims, 8 Drawing Sheets

100

```
┌─────────────────────────────────────────┐
│      PROVIDE SOLDER RESIST MATERIAL     │
│       ON A SURFACE OF A SUBSTRATE       │
│                                     105 │
└─────────────────────────────────────────┘
                    │
                    ▼
┌─────────────────────────────────────────┐
│          APPLY SOLDER RESISTANT         │
│     MASK (SRM) MATERIAL ON TOP OF       │
│       THE SOLDER RESIST MATERIAL        │
│                                     110 │
└─────────────────────────────────────────┘
                    │
                    ▼
┌─────────────────────────────────────────┐
│   REFLOW SOLDER LOCATED IN AN OPENING   │
│  FORMED THROUGH BOTH THE SOLDER RESIST  │
│       MATERIAL AND THE SRM MATERIAL     │
│                                     115 │
└─────────────────────────────────────────┘
                    │
                    ▼
┌─────────────────────────────────────────┐
│     REMOVE THE MASK MATERIAL AFTER      │
│        THE REFLOW OF THE SOLDER         │
│                                     120 │
└─────────────────────────────────────────┘
```

PROVIDE SOLDER RESIST MATERIAL ON A SURFACE OF A SUBSTRATE, THE SOLDER RESIST MATERIAL HAVING A SUBSTANTIALLY PLANAR UPPER SURFACE 305

APPLY MASK MATERIAL ON THE UPPER SURFACE OF THE SOLDER RESIST MATERIAL 310

REFLOW SOLDER LOCATED IN AN OPENING FORMED THROUGH BOTH THE SOLDER RESIST MATERIAL AND THE MASK MATERIAL 315

REMOVE THE MASK MATERIAL AFTER THE REFLOW OF THE SOLDER 320

```
PROVIDE SOLDER RESIST MATERIAL ON
A SURFACE OF A SUBSTRATE, THE
SOLDER RESIST MATERIAL HAVING A
SUBSTANTIALLY PLANAR UPPER SURFACE    505
                │
                ▼
APPLY SOLDER RESISTANT MASK (SRM)
MATERIAL ON THE UPPER SURFACE OF
THE SOLDER RESIST MATERIAL            510
                │
                ▼
REFLOW SOLDER LOCATED IN AN OPENING
FORMED THROUGH BOTH THE SOLDER RESIST
MATERIAL AND THE SRM MATERIAL         515
                │
                ▼
REMOVE THE SRM MATERIAL AFTER
THE REFLOW OF THE SOLDER              520
```

FIG. 5

SYSTEM, APPARATUS, AND METHOD FOR ADVANCED SOLDER BUMPING

BACKGROUND

There is a desire to decrease bump pitch for high I/O flip chips, including, for example, "Controlled Collapse Chip Connection" (C4) technology. The push for reduced bump pitch may result in corresponding decreases in via size opening, solder bump size, solder bump height, and other features, as well as tighter tolerances for same. To adequately address many potential applications, an understanding of IC package design and processing, including an understanding of materials and process flows may be needed.

Reliability of a flip chip may be impacted by the construction of the solder bumps and other assembly factors, including understanding and controlling the systems and methods to create the solder bumps thereof. Variations in a bumping process or aspects thereof may result in a failure and/or reduced reliability of a flip chip device or manufacturing process.

BRIEF DESCRIPTION OF THE DRAWINGS

FIG. 1 is a flow chart of an exemplary process, in accordance with some embodiments herein;

FIG. 3 is a flow chart of an exemplary process, in accordance with some embodiments herein;

FIG. 5 is another flow chart of an exemplary process, in accordance with some embodiments herein.

DETAILED DESCRIPTION

Figure 2A:
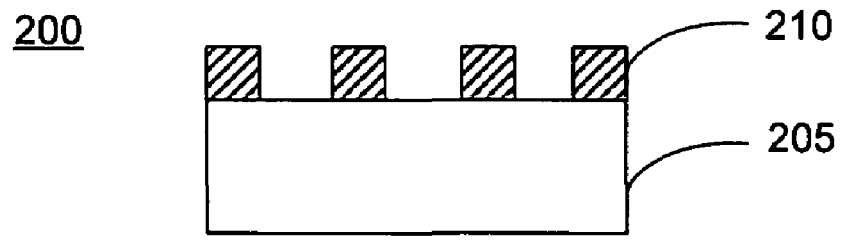
FIGS. 2A-2E are exemplary illustrations of an apparatus, at various stages of a manufacturing process, according to some embodiments hereof.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

Some embodiments hereof provide a manufacturing process for producing a flip chip package. In some embodiments, the flip chip is formed using a wafer substrate that has a conductive solder bump formed in an opening in solder resist material disposed on a surface of the substrate. In a process of forming the solder bump, a mask material is removed after a reflow process of solder, in accordance with some embodiments herein. In some embodiments, as illustrated in some of the accompanying drawings, an upper surface of the solder resist material may be substantially planar (i.e., flat), the mask material may include a solder resistant mask material that is resistant to adhering to solder, and combinations thereof.

Providing the solder resist material with a substantially planar upper surface, providing the solder resistant mask material, removing the mask material after the reflow of the solder, and various combinations thereof may facilitate a mechanism to provide solder bumps that have an improved consistency in features such as, for example, height.

Referring to FIG. 1, there is shown an exemplary flow diagram of a manufacturing process for producing an apparatus in accordance with some embodiments hereof, generally represented by the reference numeral 100. Processes herein, including process 100, may be performed by any combination of hardware, software, and/or firmware. According to some embodiments, instructions for implementing processes, including but not limited to process 100, may be stored in executable code. The code may be stored on any suitable article or medium that is or becomes known.

At operation 105, solder resist material is applied, obtained, or otherwise provided on a substrate material. The substrate material, consistent with IC manufacturing process flows, may include for example, organic dielectric materials of one or more layers. The substrate may include various IC features such as, vias and conductors.

FIG. 2A illustrates an exemplary wafer 200, including a substrate 205 having resist material 210 deposited, placed, formed or otherwise provided on a surface of substrate 205. Solder resist material 210 may be selectively patterned on top of substrate 205.

In some embodiments, an opening (e.g., a via) is formed through solder resist material 210.

Figure 2B:
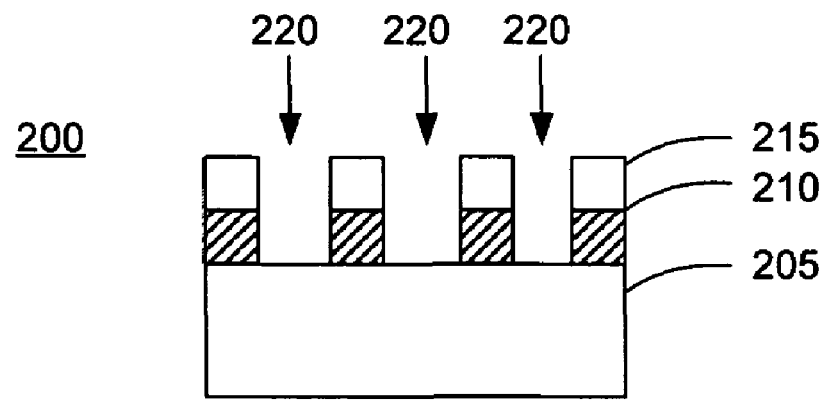

At operation 110, a solder resistant mask (SRM) material 215 is applied on solder resist material 210, as illustrated in FIG. 2B. SRM 215 may have properties that reduce or eliminate the ability of solder to adhere thereto. The ability of SRM 215 to resist adhering to solder may be based on a physical and chemical composition of the SRM. In some embodiments, the physical and chemical composition of SRM 215 are such that the ability of solder to adhere (i.e., stick) to SRM 215 is reduced or eliminated and the SRM can withstand temperatures and other stresses of an IC manufacturing process. For example, SRM 215 may retain the solder resistant properties thereof when subjected to temperatures accompanying a solder reflow process. In some embodiments during a thermal reflow process, a surface tension of solder in contact with SRM 215 will cause the solder to pull away (e.g., separate from) the SRM. An aspect of SRM 215, in accordance with some embodiments herein, is that the composition, including a coating thereon, minimizes, reduces or eliminates solder wetting to the SRM.

In some embodiments, SRM 215 is facilitated in being resistant to adhering to solder based a coating applied to a surface thereof. For example, a coating of a polymer such as a polytetrafluoroethylene (PTFE) (e.g., Teflon®, registered trademark of E.I. du Pont de Nemours and Company) may be applied to coat the surface(s) of SRM 215. In some embodiments, an ultra-thin chemical vapor deposited tear resistant film of material may be applied to a mask material (e.g., alkyl or alkoxyl trazine-thiol based coatings, etc.), and silicone modified monolayers having controlled uniformity may be spray coated or vacuum deposited to a mask material.

FIG. 2B shows an opening 220 provided through both solder resist material 210 and SRM 215. Opening 220 may be formed through both solder resist material 210 and SRM 215 using a variety of techniques and technologies compatible with IC manufacturing flows and the various aspects and embodiments herein. In some embodiments, opening 220 may be selectively created through solder resist material 210 and SRM 215 by selectively patterning solder resist material 210 and SRM 215 in selected areas and/or selectively removing areas of solder resist material 210 and SRM 215 (separately or simultaneously) using a variety of chemical, physical, and mechanical processes and techniques. In some embodiments herein, opening 220 may be formed in solder resist material 210 using a lithography process or a laser beam and then selectively applying SRM 215 on top of the solder resist material. In some embodiments, a laser beam may be used to simultaneously create the opening formed through solder resist material 210 and SRM 215.

Figure 2C:
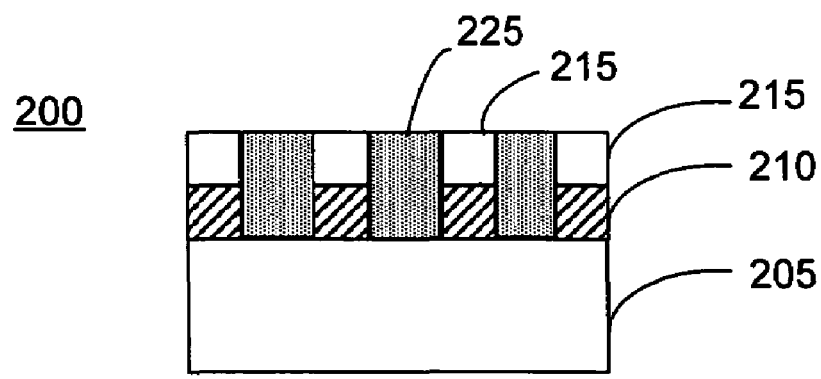

FIG. 2C illustrates wafer 200 having solder 225 placed in the openings 220 of FIG. 2B. Solder 225 may be in the form of a paste that is applied into each opening 220 using a solder printing process.

Figure 2D:
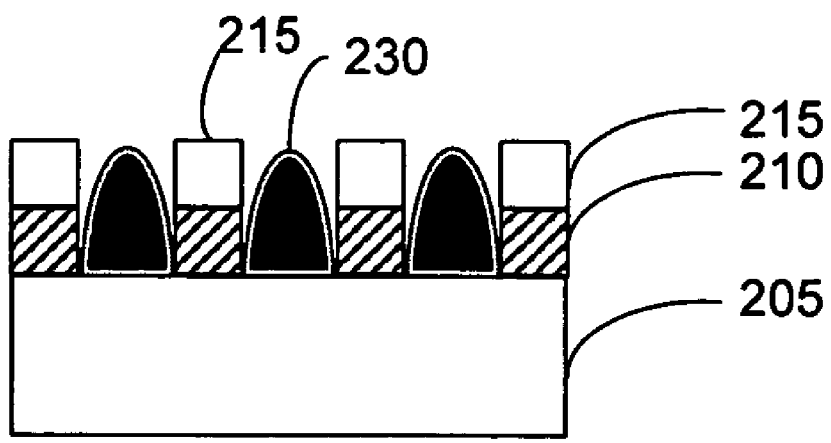

At operation 115, as further illustrated in FIG. 2D, solder located in the opening formed through solder resist 210 and SRM 215 is subjected to or undergoes a reflow process to create a solder bump 230. FIG. 2D, by way of example, illustrates three (3) solder bumps 230 formed on wafer 200. The reflow of the solder may be accomplished by subjecting the solder to temperatures sufficient to reflow the solder. In some embodiments, the opening may be a solder resist opening.

Figure 2E:
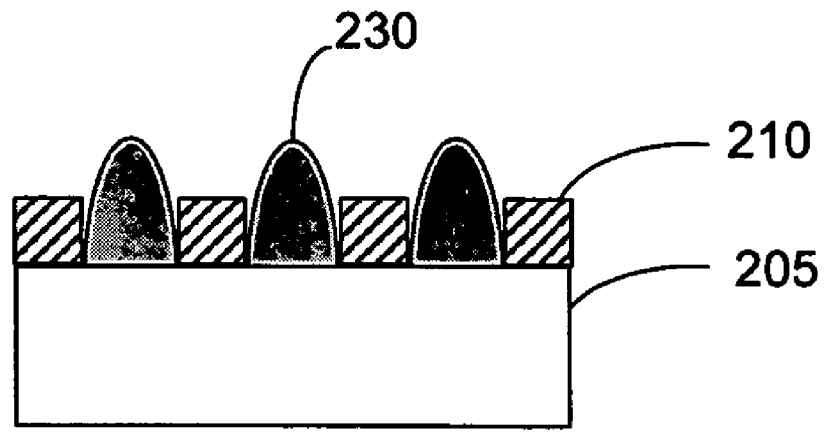

At operation 120, illustrated in FIG. 2E, SRM 215 is removed from wafer 200, after the reflow process. In some embodiments, the SRM is removed from at least an area adjacent to solder bumps 230. In some embodiments, the removal of SRM may be accomplished using a wide range of techniques and process that are compatible with other aspects of the various embodiments herein. For example, SRM 215 may be removed using a number of chemical etching processes, mechanical techniques, laser ablation, and combinations thereof.

It should be appreciated that the temperature needed to reflow the solder may vary, depending for example on the chemical composition of the solder. Those skilled in the relevant arts should appreciate this aspect of IC manufacturing. Accordingly, a discussion of specific solder materials and corresponding reflow temperatures are not included herein.

It is noted that the mask material is removed after the reflow of the solder. Thus, the solder bump is formed prior to a removal of the mask material. In this manner, process 100 reduces or avoids lifting-off solder during the removal of the mask material. By controlling the quantity of solder provided for the reflow process and removing the mask material after the reflow of the solder, the consistency or uniformity of the solder bumps formed by process 100 may be maintained.

FIG. 3 provides an exemplary flow chart in accordance with some embodiments herein. The process of FIG. 3 is generally referenced by numeral 300. Process 300 may be further understood by also referring to FIGS. 4A-4G, in conjunction with the following discussion of the flow chart of FIG. 3.

At operation 305, a wafer including a substrate having solder resist material on a first surface of the substrate is created, obtained, or otherwise provided for use in process 300. The substrate may be produced or formed using any number of methods and techniques of IC (integrated circuit) manufacturing processes that result in a substrate suitable and compatible with the various aspects and embodiments herein. The upper surface of the solder resist material is substantially planar.

It is noted that the surface of the substrate that may be used as a platform or base surface for the solder resist material (and other IC device components or features) may not be planar or flat. In some instances, a substrate may be warped (i.e., vary in curvature from being planar). In some instances, IC substrate warpage may be attributable to local undulations and global curvature. For example, for a single die substrate the local undulation may vary about 10-20 μm (micrometers), and the global curvature may vary about 40-50 μm. Such variations in substrate curvature may contribute toward solder bumps of a flip chip and other IC device approaching and/or exceeding solder bump coplanarity goals.

Figure 4A:
FIGS. 4A-4G are exemplary illustrations of an apparatus, at various stages of a manufacturing process, according to some embodiments hereof.

FIG. 4A provides an exemplary illustration of a wafer 400, including a substrate 405 as described at operation 305. It is noted that an upper surface of substrate 400 is not completely planar. That is, the upper surface of substrate 405 varies in curvature.

Figure 4B:
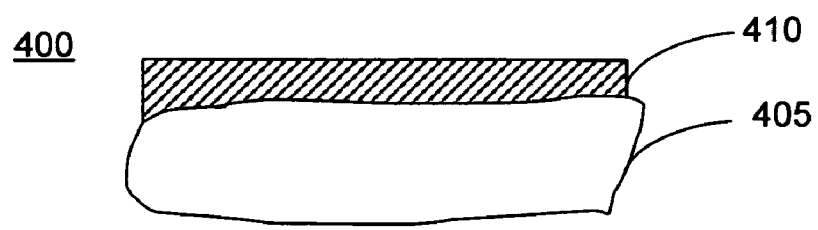

FIG. 4B illustrates wafer 400 with solder resist material 410 placed on the non-planar upper surface of substrate 405. The upper surface of solder resist material 410 is substantially planar. In FIG. 4B, the upper surface of solder resist material 410 is planar, in contrast to the non-planar surface on which solder resist material 410 is located.

In some embodiments, the upper surface of solder resist material 410 is made flat by controlling a flow behavior of a liquid solder resist material prior to a cure thereof to compensate for the local and global warpage, a hot-press lamination process on pre-cured solder resist material to flatten the upper surface of the solder resist material, chemical polishing, mechanical polishing, and combinations thereof.

In some embodiments, the planarity of solder resist material 410 may be controlled or improved by controlling the deformation and flow (i.e., rheological), and shrinkage aspects of the solder resist material upon a cure thereof. Some, but not all, examples may include photo definable benozocyclobutene based materials, alkoxy silane modified organic-inorganic hybrids, etc. In addition to improved material design, process optimization relating to, for example, coating, print process optimization (e.g., two-step coatings, etc.) may be used.

In some embodiments, a hot-press lamination process on a pre-cured resist material may be used with or without a cover film. The cover film may include Polyethylene terephthalate (i.e., PET).

Figure 4C:
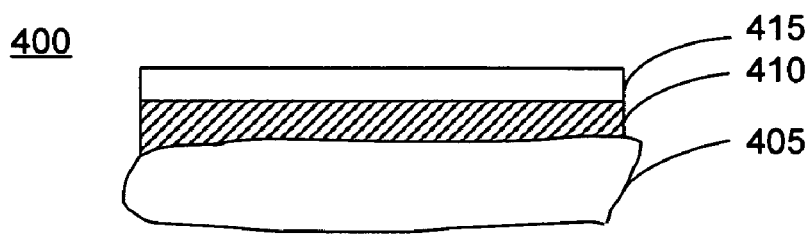

At operation 310, a mask material is placed on the planar upper surface of the solder resist material. This aspect of process 300 is illustrated in FIG. 4C wherein mask material 415 is shown disposed on top of the planar upper surface of solder resist material 410.

In some embodiments, an upper surface of mask material 415 is made planar (i.e., planarized). Those methods and techniques discussed with respect to making solder resist material 410 planar, as well as other planarizing methods and techniques, may be used to planarize mask material 415.

At operation 315, solder located in an opening formed through or in both the solder resist material and the mask material is reflowed to create a solder bump in the opening. The reflow process is compatible with other aspects and embodiments herein.

Figure 4D:
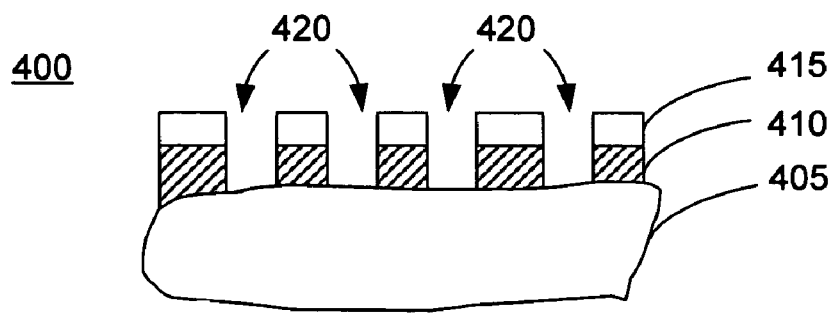
Figure 4E:
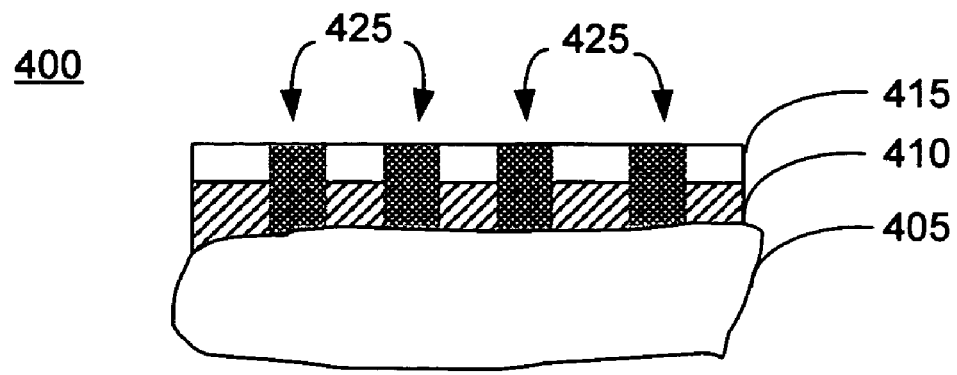
Figure 4F:
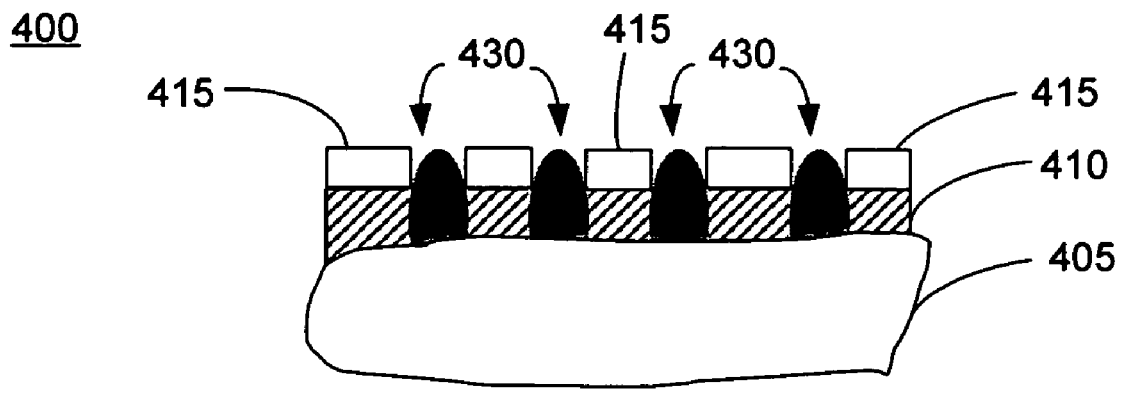

FIGS. 4D-4F provide an exemplary illustration of operation 315. FIG. 4D illustrates an opening 420 provided through both solder resist material 410 and mask material 415. Although four (4) openings 420 are illustrated, any number from one to more may be provided. In some embodiments, openings 420 may be vias that include features of IC devices such as, for example, metallization, interconnects, etc.

FIG. 4E, illustrates wafer 400 wherein solder 425 is shown in the openings formed through both solder resist material 410 and mask material 415. In some embodiments herein, solder 425 is placed in the openings using a solder printing process (e.g., squeegee printing).

In accordance with some embodiments herein, the quantity of solder placed in the openings through the solder resist material 410 and mask material 415 may be controlled due, at least in part, to the planarity of the solder resist material 410 and mask material 415.

In FIG. 4F, solder 425 has been subjected to a reflow process. The thermal temperatures of the reflow process may cause a liquid flow of solder 425 and the formation of a solder bump 430 therefrom. The temperatures associated with the reflow process are compatible with the materials in the various embodiments herein.

At operation 320, the mask material is removed. It is noted that the mask material is removed after the reflow of the solder. Thus, the solder bump is formed prior to a removal of the mask material. In this manner, process 300 reduces or avoids creating solder bumps of varying heights. That is, the consistency of the solder bumps may be controlled per the operations of process 300.

Figure 4G:
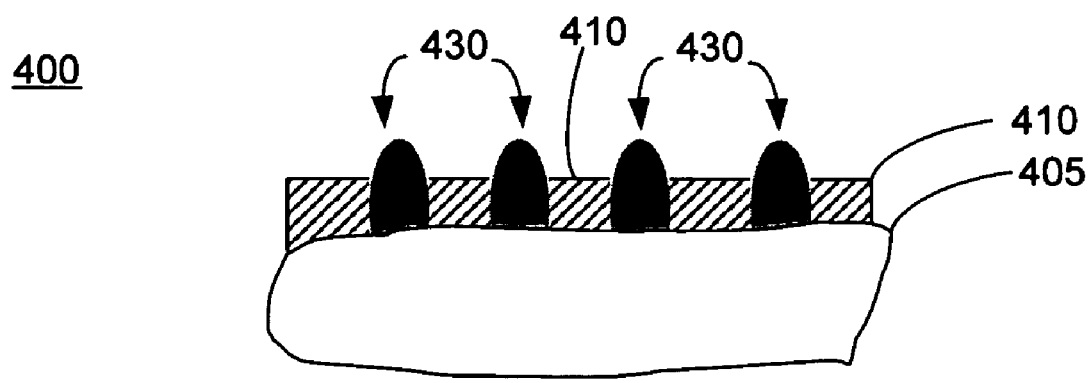

FIG. 4G illustrates wafer 400 with mask material 415 removed therefrom. It is noted that solder bumps 430 exhibit a consistency or uniformity. The consistency or uniformity of the solder bumps formed by process 300 may be achieved due to the planarity of solder resist material 410 and mask material 415 that contributes to a quantity of solder sufficient to render consistent solder bumps, and to the removal of mask material 415 after the reflow process that minimizes, reduces, or eliminates a lift-off of solder from wafer 400.

FIG. 5 provides an exemplary flow chart in accordance with some embodiments herein. The process of FIG. 5 is generally referenced by numeral 500. Process 500, in some regards, includes a number of aspects already discussed with regards to process 100, process 300, and FIGS. 1, 2A-2E, 3, and 4A-4G.

At operation 500, a wafer including a substrate having solder resist material on a first surface of the substrate is created, obtained, or otherwise provided for use in process 500. The upper surface of the solder resist material is substantially planar. It is noted that the surface to which the solder resist material is applied to may or may not be planar or flat. In some instances, it is noted that a substrate may vary in curvature from being planar.

At operation 510, a solder resistant mask (SRM) material is applied on the solder resist material. The SRM may have properties that reduce or eliminate the ability of solder to adhere thereto. The ability of the SRM to resist adhering to solder may be based on physical and chemical composition of the SRM. The SRM may be made resistant to solder wetting by a number of processes, including those disclosed herein with regards to other embodiments. An aspect of the SRM, in accordance with some embodiments herein, is that the composition, including a coating thereon, minimizes, reduces or eliminates solder wetting to the SRM.

At operation 515, solder located in an opening formed through or in both the solder resist material and the mask material is reflowed to create a solder bump in the opening. The reflow process is compatible with other aspects and embodiments herein.

At operation 520, the SRM material is removed from the wafer, after a reflow process provide to create a solder bump. In some embodiments, the SRM material is removed from at least an area adjacent to the solder bump. In some embodiments, the removal of the SRM material may be accomplished using a wide range of techniques and process that are compatible with other aspects of the various embodiments herein.

The SRM material is removed after the reflow of the solder. The solder bump is formed prior to a removal of the SRM material. In this manner, process 500 may reduce or avoid lifting-off solder during the removal of the SRM material. By controlling the quantity of solder provided for the reflow process based on the planarization of the solder resist material (and the SRM material in some embodiments) and removing the SRM material after the reflow of the solder, the consistency or uniformity of the solder bumps formed by process 500 may be controlled.

In some embodiments, an opening (e.g., 420, 520) may be formed through both solder resist material and mask material (e.g., SRM) to a depth that extends down to a solder bump pad (e.g., a bump site). In some embodiments, the opening may extend down through both solder resist material and mask material to an under bump metallization (UBM) layer (not shown) and/or other material.

In some embodiments, sidewalls of an opening (e.g., 420, 520) may act to contain the solder therein during a reflow process.

In some embodiments herein, removal of mask material (including SRM) after the reflow process to create solder bump facilitates a mechanism for providing consistent or uniform solder bumps. By controlling the size of the opening, the amount of solder placed in the opening, and removing mask material after the reflow process, the amount of solder subjected to the reflow process may be consistently maintained. Thus, consistent or uniform solder bumps may be provided in accordance with some of the embodiments herein.

In some embodiments, the height of the solder bumps created in accordance with some embodiments herein may vary about 10 µm (micrometers) or less, such as about 5 µm.

In some embodiments herein, the opening created through both the solder resist material and the mask material is done substantially at the same time. For example, the opening through both the solder resist material and the mask material may be made using a laser beam in a LPP (laser projection patterning) process. Other methods, techniques, and processes may be used to create the opening through both the solder resist material and the mask material. In this manner, alignment of the opening through the solder resist material and the opening through the mask material may coincide. That is, the opening through both the solder resist material and the mask material may be coincident through the different materials.

In some embodiments, the opening through both of the solder resist and mask materials may be made at the same time to achieve alignment of the opening through the various layers (e.g., solder resist material, mask material) of the opening. In some embodiments, an alignment tolerance of about 5 µm or less may be achieved by making the opening through the various layers at the same time.

In some embodiments herein, the mask material is not constructed of a photosensitive material. For example, in some embodiments herein the mask material is removed using, for example, a laser beam. Accordingly, the mask material need not be photosensitive to effectuate an etching process that depends on the photosensitivity of the mask material.

In some embodiments herein, the mask material (e.g., 515) is a disposable mask material. As such, a cost savings may be realized by some of the methods, apparatuses, and systems herein. For example, the mask material may not have certain properties needed in other IC manufacturing processes such as, for example, photosensitivity, etc. Disposable mask materials compatible with some embodiments herein.

In some embodiments, the mask material (e.g., 415) may be a re-usable mask material.

Figure 6:
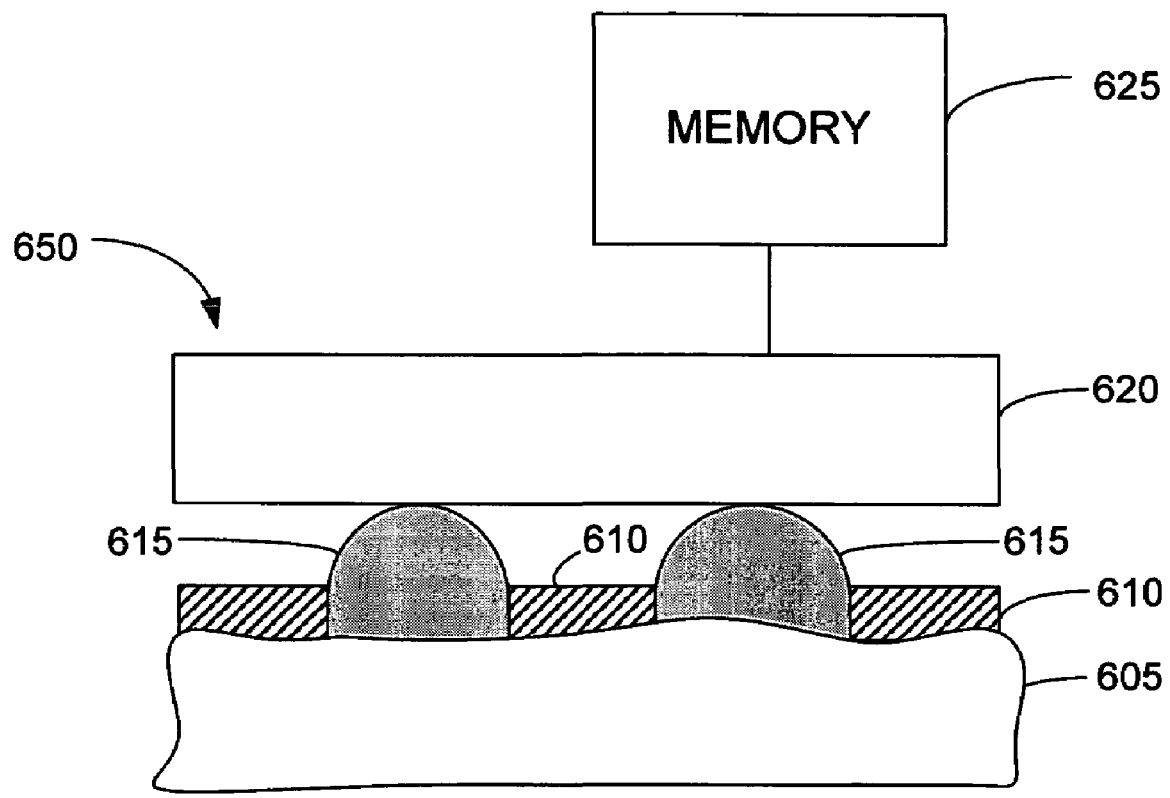
FIG. 6 is an exemplary illustration of a system, according to some embodiments hereof.

FIG. 6 is an exemplary depiction of a system 600 including an apparatus, for example a flip chip IC package 650, having solder bumps 615 created in accordance with some embodiments herein. Flip chip 650 may be connected to a memory 625. Those in the art should appreciate that system 400 may include additional, fewer, or alternative components to flip chip 650 and memory 625. Memory 625 may comprise any type of memory for storing data, including but not limited to a Single Data Rate Random Access Memory, a Double Data Rate Random Access Memory, or a Programmable Read Only Memory.

In some embodiments, system 600 may include solder bumps 615 created in an opening (e.g., a via) in solder resist material 610 having a planarized upper surface. Solder bumps 615 may be created by applying solder resistant mask (SRM) material (not shown in FIG. 6) on the planarized upper surface of solder resist material 610, subjecting solder placed in an opening formed through solder resist 610 and the SRM material to a reflow process, and removing the SRM material from at least an area adjacent to solder bump 615 after reflowing the solder to create solder bumps 615.

In some embodiments, IC device 620 is placed in contact with solder bumps 615. IC device 620 may contact solder bumps 615 at conductive connectors, pads, and traces (not shown) to provide electrical connectivity between IC device 620 and substrate 605, through solder bumps 615. In some embodiments, an apparatus, system, and device may include solder bumps 615 created by removing a SRM material (not shown) previously disposed on top of solder resist material 610 and subsequently removed therefrom after a reflow process used to create solder bumps 615.

It should be appreciated that the drawings herein are illustrative of various aspects of the embodiments herein, not exhaustive of the present disclosure. For example, it should be appreciated that FIGS. 2A-2E, 4A-4G, and 6 may include under bump metallization (UBM), underfill materials, and other flip chip features, components, and attributes.

The several embodiments described herein are solely for the purpose of illustration. Persons in the art will recognize from this description that other embodiments may be practiced with modifications and alterations limited only by the claims.

What is claimed is:

1. A method comprising:
   providing solder resist material on a surface of a substrate, the solder resist material having a substantially planar upper surface;
   forming an opening through the solder resist material;
   applying solder resistant mask (SRM) material on the upper surface of the solder resist material having the opening therethrough, wherein the solder resist material and the SRM material applied thereto are aligned to create an opening through both the solder resist material and the SRM material;
   reflowing solder located in the opening formed through both the solder resist material and the SRM material to create a solder bump; and
   removing the mask material after the reflowing of the solder.

2. The method of claim 1, wherein the upper surface of the solder resist material is made substantially flat by at least one of the following: controlling a flow behavior of a liquid solder resist material prior to a cure thereof, a hot-press lamination process on pre-cured solder resist material, chemical polishing, mechanical polishing, and combinations thereof.

3. The method of claim 1, wherein the SRM material is selected from one of the following: a reusable solder mask and a disposable solder mask.

4. The method of claim 1, further comprising:
   reflowing solder located in a plurality of openings formed through both the solder resist material and the mask material to create a plurality of solder bumps; and
   removing the mask material after the reflowing of the solder in the plurality of openings.

5. The method of claim 1, wherein in a wherein a variance in height for the solder bump is about 10 μm or less.

6. The method of claim 5, wherein the variance in height is about 5 μm or less.

7. The method of claim 1, wherein the opening through both the solder resist material and the SRM material is created by lithography.

8. The method of claim 1, wherein the removing of the SRM material is accomplished using at least one of a chemical technique and a laser ablation technique.

9. The method of claim 1, wherein the SRM material is planarized to have a substantially planar upper surface.

10. The method of claim 1, wherein the SRM material is resistant to adhering to solder based on at least one of the following: applying a silicone modified monolayer to the mask material and applying a coating of solder resistant material to an outer surface of the mask material.

* * * * *